(12) United States Patent
Chen et al.

(10) Patent No.: US 11,439,036 B2
(45) Date of Patent: Sep. 6, 2022

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 17/009,946

(22) Filed: Sep. 2, 2020

(65) Prior Publication Data
US 2021/0337695 A1 Oct. 28, 2021

(30) Foreign Application Priority Data

Apr. 28, 2020 (TW) .................................. 109114469

(51) Int. Cl.
*H05K 7/18* (2006.01)
*A47B 96/07* (2006.01)
*A47B 88/00* (2017.01)

(52) U.S. Cl.
CPC ............. *H05K 7/183* (2013.01); *A47B 96/07* (2013.01); *A47B 88/00* (2013.01)

(58) Field of Classification Search
CPC .......... H05K 7/183; A47B 96/07; A47B 88/00

USPC ........ 248/219.1, 298.4, 316.8, 250; 312/333, 312/334.7, 334.8, 334.46, 334.44, 330.1
See application file for complete search history.

(56) References Cited

U.S. PATENT DOCUMENTS

| | | | |
|---|---|---|---|
| 6,655,534 B2 * | 12/2003 | Williams | H05K 7/183 211/26 |
| 7,134,558 B1 | 11/2006 | Mimlitch, III et al. | |
| 7,798,582 B2 * | 9/2010 | Yu | A47B 88/43 312/334.4 |
| 7,866,488 B2 | 1/2011 | Mimlitch, III et al. | |
| 8,083,298 B2 * | 12/2011 | Henderson | H05K 7/1489 312/223.1 |
| 8,585,166 B2 * | 11/2013 | Chen | A47B 88/493 312/334.46 |
| 9,560,786 B2 * | 1/2017 | Chen | A47B 88/447 |
| 10,477,965 B1 * | 11/2019 | Chen | H05K 7/1489 |
| 10,595,435 B2 * | 3/2020 | Chen | H05K 7/183 |

(Continued)

FOREIGN PATENT DOCUMENTS

| EP | 3094165 A1 | 11/2016 |
|---|---|---|
| EP | 3131375 A2 | 2/2017 |

(Continued)

*Primary Examiner* — Nkeisha Smith
(74) *Attorney, Agent, or Firm* — Rosenberg, Klein & Lee

(57) ABSTRACT

A slide rail assembly includes a rail member, a first bracket device, a second bracket device, and a bracket member. The first bracket device is arranged on the rail member. The second bracket device is detachably mounted on one of the rail member and the first bracket device and is adjustable to displace with respect to the rail member. The bracket member can be detachably mounted on the one of the rail member and the first bracket device after the second bracket device is detached from the one of the rail member and the first bracket device.

15 Claims, 16 Drawing Sheets

(56) References Cited

U.S. PATENT DOCUMENTS

| | | | |
|---|---|---|---|
| 10,806,256 B1* | 10/2020 | Chen | A47B 88/483 |
| 2003/0136749 A1 | 7/2003 | Williams et al. | |
| 2009/0218301 A1 | 9/2009 | Mimlitch, III et al. | |
| 2010/0243586 A1 | 9/2010 | Henderson et al. | |
| 2015/0245709 A1* | 9/2015 | Iwamoto | A47B 88/40 |
| | | | 211/175 |
| 2015/0335156 A1 | 11/2015 | Chen et al. | |
| 2017/0238438 A1 | 8/2017 | Shearman et al. | |
| 2018/0168349 A1 | 6/2018 | Chen | |

FOREIGN PATENT DOCUMENTS

| | | |
|---|---|---|
| JP | 3152281 U | 7/2009 |
| JP | 2017189587 A | 10/2017 |
| JP | 2019005546 A | 1/2019 |
| TW | 483660 U | 4/2002 |

\* cited by examiner

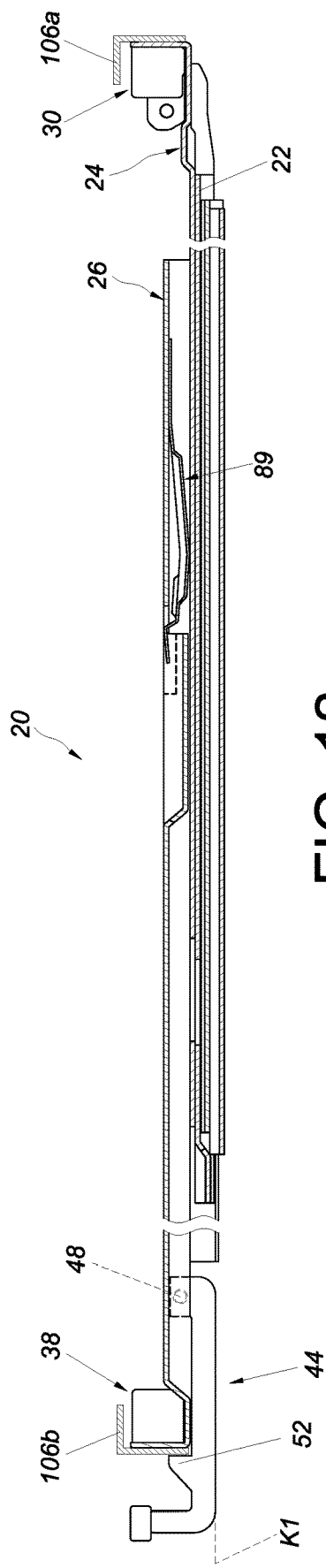
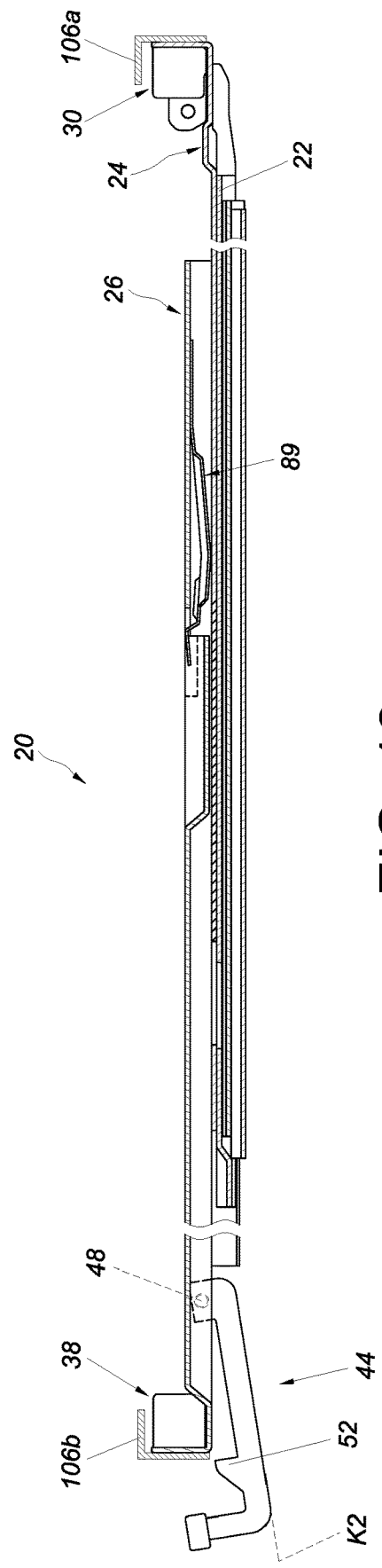

SLIDE RAIL ASSEMBLY

FIELD OF THE INVENTION

The present invention relates to a slide rail assembly and more particularly to a slide rail assembly that can be mounted on racks of two different configurations.

BACKGROUND OF THE INVENTION

U.S. Pat. No. 6,655,534 B2 discloses a configurable rack rail system for dual mount configurations. The rack rail system includes first and second opposing rails. Each rail includes a first bracket (front bracket), a second bracket (rear bracket), and a third bracket detachably connected between the first bracket and the second bracket. The third bracket of each rail can be positioned at a first position, and each rail can be mounted on a post of a first type through the third bracket of the rail when the third bracket is at the first position (as shown in FIG. 1 and FIG. 2 of the '534 patent). Or, the third brackets of the rails can be rotated by 180° and exchanged with each other so as to be each positioned at a second position, and each rail can be mounted on a post of a second type through the third bracket of the rail when the third bracket is at the second position (as shown in FIG. 3 and FIG. 4 of the '534 patent). As each bracket in the '534 patent is formed with a pair of slots in the bracket body, the structural strength of the brackets is compromised, making it unsuitable to mount those brackets on a four-post rack.

U.S. Pat. No. 8,083,298 B2 discloses a slide rail that includes a bracket support member, a first toolless connection bracket, a second toolless connection bracket, a first tooled connection bracket, and a second tooled connection bracket. The first and the second toolless connection brackets are connected to the bracket support member, and so are the first and the second tooled connection brackets. The first and the second toolless connection brackets are configured to be connected to a first post and a second post of a four-post rack respectively, and the first and the second tooled connection brackets are configured to be connected to two opposite sides of a post of a two-post rack respectively. A rear bracket base can be adjusted, i.e., displaced, with respect to the bracket support member and includes the second toolless connection bracket and the second tooled connection bracket. When the rear bracket base is at a first rear supporting position, the second tooled connection bracket is proximate to a rear portion of the bracket support member in order to support an information handling system in a tooled configuration (as shown in FIG. 1A and FIG. 1B of the '298 patent). When the rear bracket base is at a second rear supporting position, the second toolless connection bracket is proximate to the rear portion of the bracket support member in order to support the information handling system in a toolless configuration (as shown in FIG. 2A and FIG. 2B of the '298 patent). As the distance by which each bracket in the '298 patent can be adjusted is limited, the brackets may have problem being mounted on a four-post server rack that has a relatively great depth. The same problem is shared by U.S. Pat. No. 7,134,558 B1 and U.S. Pat. No. 7,866,488 B2.

As user needs vary, there may be cases in which it is not desirable to use the designs of the four patents cited above to render a slide rail assembly mountable on racks of at least two configurations. It is therefore worthwhile to develop a different slide rail product so as to provide consumers with more alternatives.

SUMMARY OF THE INVENTION

One objective of the present invention is to provide a slide rail assembly whose brackets can be detached and exchanged to adapt the slide rail assembly to racks of different configurations.

According to one aspect of the present invention, a slide rail assembly includes a rail member, a first bracket device, a second bracket device, and a first bracket member. The first bracket device is arranged on the rail member. The second bracket device is detachably mounted on one of the rail member and the first bracket device and can be adjusted, or more particularly displaced, with respect to the rail member. The first bracket member can be detachably mounted on the one of the rail member and the first bracket device after the second bracket device is detached from the one of the rail member and the first bracket device.

Preferably, the first bracket device and the second bracket device are configured to mount the rail member on a rack of a first type, and the rack of the first type is a four-post rack.

Preferably, the rail member includes a first wall, a second wall, and a longitudinal wall connected between the first wall and the second wall; the first bracket device includes a first sidewall and at least one first mounting member; the first sidewall includes a first portion, a second portion, and a first longitudinal portion arranged between the first portion and the second portion; the first portion, the second portion, and the first longitudinal portion of the first bracket device are respectively adjacent to the first wall, the second wall, and the longitudinal wall of the rail member; the at least one first mounting member is configured to be mounted on a first post of the rack of the first type; the second bracket device includes a second sidewall and at least one second mounting member; the second sidewall includes a third portion, a fourth portion, and a second longitudinal portion arranged between the third portion and the fourth portion; the third portion, the fourth portion, and the second longitudinal portion of the second bracket device define a supporting channel for receiving the first sidewall of the first bracket device; and the at least one second mounting member is configured to be mounted on a second post of the rack of the first type.

Preferably, the second bracket device further includes a fastening member pivotally connected to the second sidewall and an elastic member. The fastening member is configured to stay at a locking position in response to the elastic force of the elastic member in order to be locked to the second post of the rack of the first type.

Preferably, the third portion, the fourth portion, and the second longitudinal portion of the second sidewall of the second bracket device are configured to partially enclose the first portion, the second portion, and the first longitudinal portion of the first sidewall of the first bracket device respectively.

Preferably, the second bracket device and the first bracket device define a first length therebetween when the second bracket device is at a first predetermined position with respect to the rail member, and the second bracket device and the first bracket device define a second length therebetween when the second bracket device is at a second predetermined position with respect to the rail member, wherein the second length is greater than the first length.

Preferably, the first bracket device is connected to the rail member, at least one of the first bracket device and the rail member includes a first structure, and the second bracket device includes a second structure configured to be detachably engaged with the first structure.

Preferably, the slide rail assembly further includes a second bracket member configured to be detachably mounted on the one of the rail member and the first bracket device, the first bracket member and the second bracket member are configured to mount the rail member on a rack of a second type, and the rack of the second type is a two-post rack.

Preferably, the first bracket member and the second bracket member can be adjusted, or more particularly displaced, with respect to the rail member.

Preferably, each of the first bracket member and the second bracket member includes at least one mounting feature through which at least one connecting member can be passed, and the first bracket member and the second bracket member are mountable on a post of the rack of the second type through the at least one connecting member.

Preferably, the slide rail assembly further includes at least one movable rail that is mounted in a channel of the rail member and that can be displaced with respect to the rail member.

Another object of the present invention is to provide a slide rail assembly whose slide rails and brackets feature enhanced structural strength therebetween.

According to another aspect of the present invention, a slide rail assembly includes a rail member, a first bracket device, and a second bracket device. The rail member includes a first wall, a second wall, and a longitudinal wall connected between the first wall and the second wall. The first bracket device is arranged on the rail member and includes a first sidewall. The first sidewall includes a first portion, a second portion, and a first longitudinal portion arranged between the first portion and the second portion. The first portion, the second portion, and the first longitudinal portion of the first bracket device are configured to support the first wall, the second wall, and the longitudinal wall of the rail member respectively. The second bracket device is arranged on the first sidewall of the first bracket device and includes a second sidewall. The second sidewall includes a third portion, a fourth portion, and a second longitudinal portion arranged between the third portion and the fourth portion. The third portion, the fourth portion, and the second longitudinal portion of the second bracket device are configured to support the first portion, the second portion, and the first longitudinal portion of the first bracket device respectively.

Preferably, the first bracket device further includes at least one first mounting member, and the second bracket device further includes at least one second mounting member. The at least one first mounting member is configured to mount the rail member on a first post of a rack of a first type, and the at least one second mounting member is configured to mount the rail member on a second post of the rack of the first type.

Preferably, the second bracket device is detachably mounted on the first sidewall of the first bracket device and can be adjusted, or more particularly displaced, with respect to the rail member.

Preferably, the second bracket device and the first bracket device define a first length therebetween when the second bracket device is at a first predetermined position with respect to the rail member, and the second bracket device and the first bracket device define a second length therebetween when the second bracket device is at a second predetermined position with respect to the rail member, wherein the second length is greater than the first length.

Preferably, the first bracket device is connected to the rail member, at least one of the first bracket device and the rail member includes a first structure, and the second bracket device includes a second structure configured to be detachably engaged with the first structure.

Preferably, the slide rail assembly further includes a first bracket member and a second bracket member, and the first bracket member and the second bracket member can be detachably mounted on the first sidewall of the first bracket device after the second bracket device is detached from the rail member.

Preferably, the first bracket member and the second bracket member can be adjusted, or more particularly displaced, with respect to the rail member.

Preferably, the first bracket member and the second bracket member are configured to mount the rail member on a rack of a second type.

Preferably, each of the first bracket member and the second bracket member includes at least one mounting feature through which at least one connecting member can be passed, and the first bracket member and the second bracket member are mountable on a post of the rack of the second type through the at least one connecting member.

BRIEF DESCRIPTION OF THE DRAWINGS

FIG. 12 is a schematic view showing that the slide rail assembly according to the embodiment of the present invention is mounted on the first-type rack through the first-type bracket mechanism, with a fastening member locked to the first-type rack;

FIG. 13 is a schematic view showing that the slide rail assembly according to the embodiment of the present invention is mounted on the first-type rack through the first-type bracket mechanism, wherein the fastening member is not locked to the first-type rack;

DETAILED DESCRIPTION OF THE INVENTION

Figure 1:
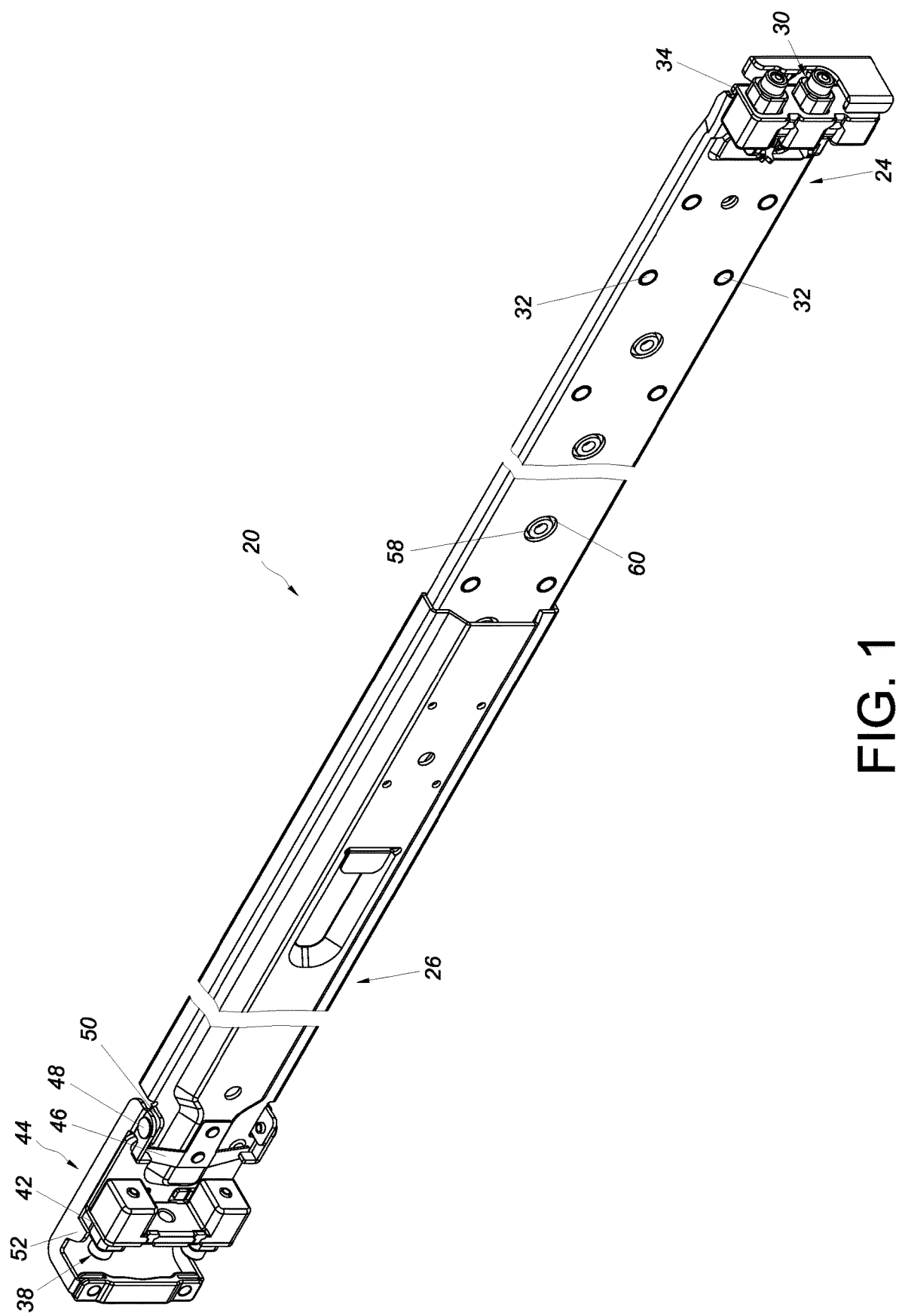
FIG. 1 is a perspective view of the slide rail assembly having a first-type bracket mechanism according to an embodiment of the present invention.
Figure 2:
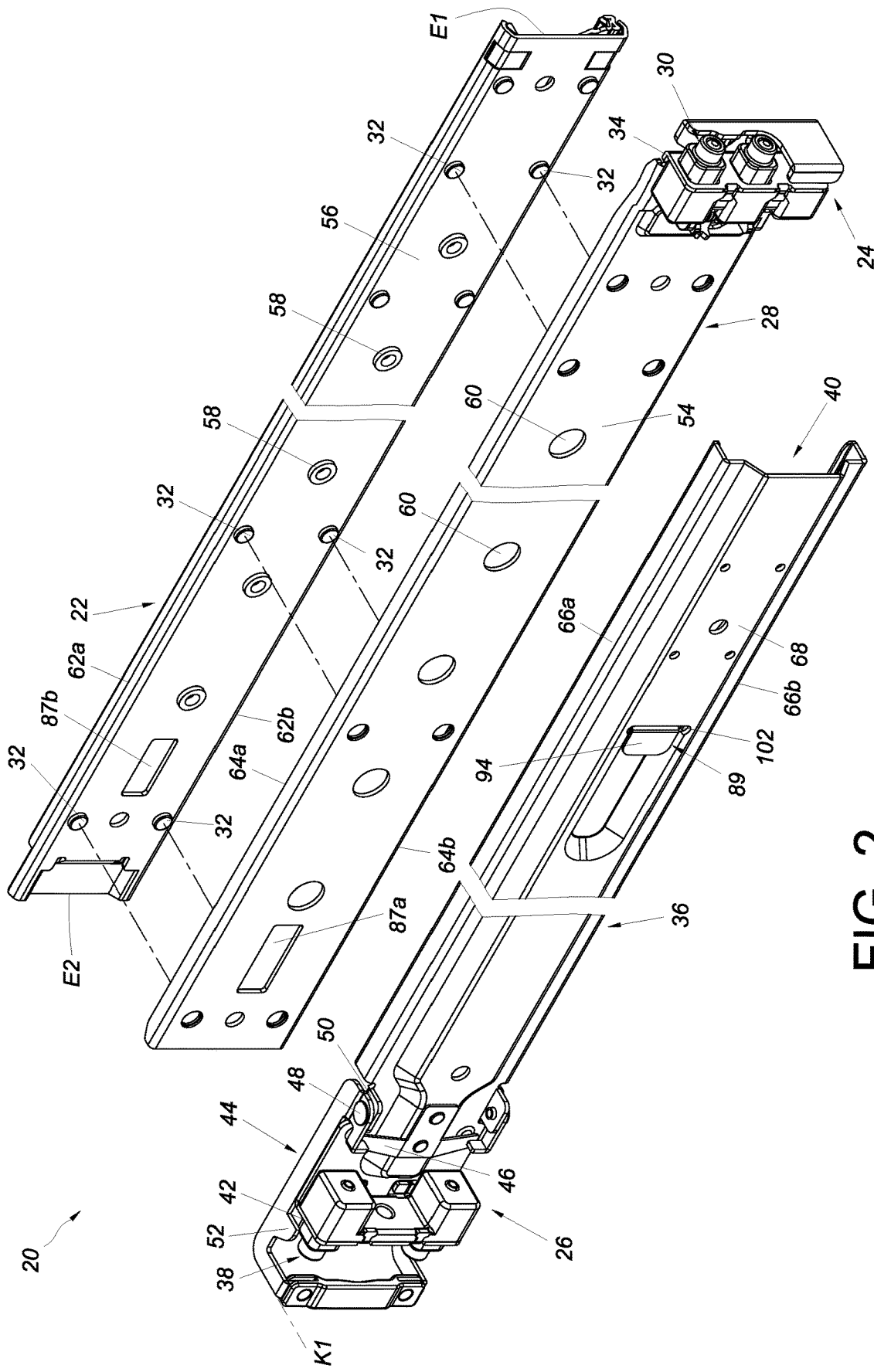
FIG. 2 is an exploded perspective view of the slide rail assembly having the first-type bracket mechanism according to the embodiment of the present invention.

Referring to FIG. 1 and FIG. 2, a slide rail assembly 20 according to an embodiment of the present invention includes a rail member 22, a first bracket device 24, and a second bracket device 26.

The rail member 22 has two opposite end portions, namely a first end portion E1 and a second end portion E2.

The first bracket device 24 is arranged on the rail member 22. The first bracket device 24 includes a first sidewall 28 and at least one first mounting member 30. The first sidewall 28 may be connected (fixedly connected) to the rail member 22 by, for example, riveting, soldering, or threaded connection. In this embodiment, the first sidewall 28 is connected to the rail member 22 by a plurality of connecting portions 32 such that the first bracket device 24 can be viewed as a portion of the rail member 22. The at least one first mounting member 30 is arranged adjacent to the first end portion E1 of the rail member 22. Preferably, the first bracket device 24 further includes a first end wall 34 substantially perpendicularly bent with respect to the first sidewall 28, and the at least one first mounting member 30 is disposed at the first end wall 34.

The second bracket device 26 is detachably mounted on one of the rail member 22 and the first bracket device 24. Here, the second bracket device 26 is detachably mounted on the first sidewall 28 of the first bracket device 24, and the second bracket device 26 can be adjusted, i.e., displaced, with respect to the rail member 22. For example, the second bracket device 26 can be adjusted, i.e., displaced, along the length direction of the rail member 22.

The second bracket device 26 includes a second sidewall 36 and at least one second mounting member 38. For example, the second sidewall 36 has a supporting channel 40 into which the first sidewall 28 of the first bracket device 24 can be inserted. Preferably, the second bracket device 26 further includes a second end wall 42 substantially perpendicularly bent with respect to the second sidewall 36, and the at least one second mounting member 38 is disposed at the second end wall 42. Preferably, the second bracket device 26 further includes a fastening member 44 and an elastic member 46. The fastening member 44 is pivotally connected to a lug 50 of the second sidewall 36 by a shaft 48, and the fastening member 44 is configured to stay at a locking position K1 in response to the elastic force of the elastic member 46 so that a fastening portion 52 of the fastening member 44 is adjacent to the at least one second mounting member 38.

Preferably, the first sidewall 28 of the first bracket device 24 has a first longitudinal portion 54 connected to a longitudinal wall 56 of the rail member 22, the longitudinal wall 56 has a plurality of mounting features 58, and the first longitudinal portion 54 has a plurality of holes 60 corresponding respectively to the mounting features 58.

Figure 3:
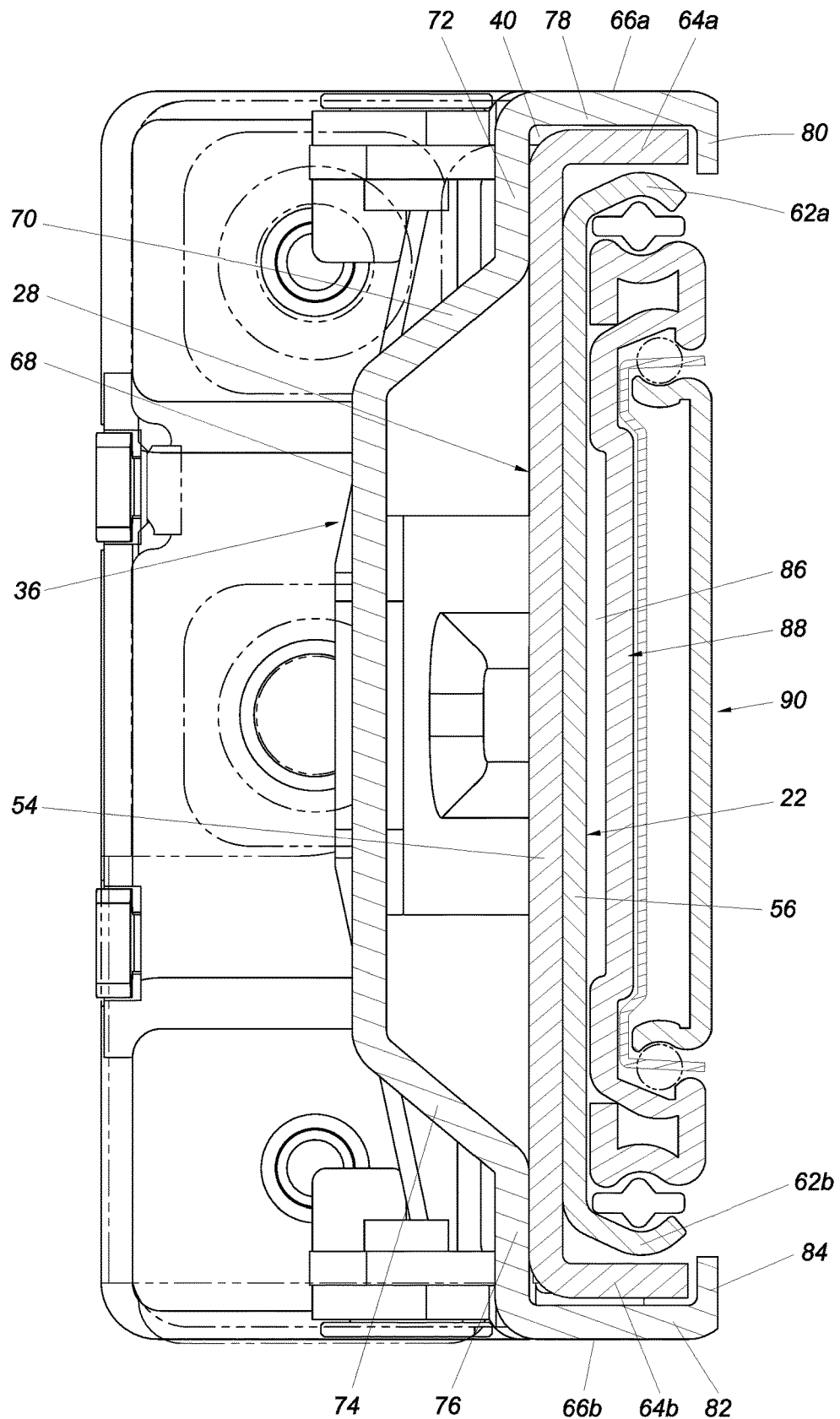
FIG. 3 is a sectional view of the slide rail assembly having the first-type bracket mechanism according to the embodiment of the present invention.

As shown in FIG. 2 and FIG. 3, the rail member 22 includes a first wall 62a and a second wall 62b. The longitudinal wall 56 is connected between the first wall 62a and the second wall 62b.

The first sidewall 28 of the first bracket device 24 includes a first portion 64a and a second portion 64b. The first longitudinal portion 54 is arranged between the first portion 64a and the second portion 64b. The first portion 64a, the second portion 64b, and the first longitudinal portion 54 of the first bracket device 24 are respectively adjacent to the first wall 62a, the second wall 62b, and the longitudinal wall 56 of the rail member 22. Preferably, the first portion 64a and the second portion 64b are substantially perpendicularly connected to the first longitudinal portion 54.

The second sidewall 36 of the second bracket device 26 includes a third portion 66a, a fourth portion 66b, and a second longitudinal portion 68 arranged between the third portion 66a and the fourth portion 66b. The third portion 66a, the fourth portion 66b, and the second longitudinal portion 68 of the second bracket device 26 define the supporting channel 40, and the supporting channel 40 is used to receive the first sidewall 28 of the first bracket device 24. The third portion 66a, the fourth portion 66b, and the second longitudinal portion 68 of the second sidewall 36 of the second bracket device 26 are configured to partially enclose the first portion 64a, the second portion 64b, and the first longitudinal portion 54 of the first sidewall 28 of the first bracket device 24 respectively.

More specifically, the first portion 64a, the second portion 64b, and the first longitudinal portion 54 of the first sidewall 28 are configured to support the first wall 62a, the second wall 62b, and the longitudinal wall 56 of the rail member 22 respectively. The second sidewall 36 of the second bracket device 26 is movably arranged on the first sidewall 28 of the first bracket device 24. The third portion 66a, the fourth portion 66b, and the second longitudinal portion 68 of the second bracket device 26 are configured to support the first portion 64a, the second portion 64b, and the first longitudinal portion 54 of the first bracket device 24 respectively.

Preferably, referring to FIG. 3, the second longitudinal portion 68 includes a first section 70 and a second section 72, and the two sections 70 and 72 are bent with respect to each other and are adjacent to the third portion 66a. It is also preferable that the second longitudinal portion 68 includes a third section 74 and a fourth section 76, and that the two sections 74 and 76 are bent with respect to each other and are adjacent to the fourth portion 66b. The first section 70 and the third section 74 extend slantingly outward with respect to each other and are connected to the second section 72 and the fourth section 76 respectively. The second section 72 and the fourth section 76 of the second longitudinal portion 68 are configured to support the first longitudinal portion 54, thereby producing the supporting effect of a reinforcing rib.

Preferably, the third portion 66a includes a first extension section 78 and a second extension section 80 bent with respect to the first extension section 78. The first extension section 78 of the third portion 66a is configured to support the first portion 64a, and the second extension section 80 of the third portion 66a is adjacent to a lateral end side of the first portion 64a so as to support the lateral end side of the first portion 64a. It is also preferable that the fourth portion 66b includes a third extension section 82 and a fourth extension section 84 bent with respect to the third extension section 82, that the third extension section 82 of the fourth portion 66b is configured to support the second portion 64b, and that the fourth extension section 84 of the fourth portion 66b is adjacent to a lateral end side of the second portion 64b so as to support the lateral end side of the second portion 64b.

Preferably, the slide rail assembly 20 further includes at least one movable rail, such as a first movable rail 88 and a second movable rail 90, and the at least one movable rail and the first bracket device 24 are located on two opposite sides of the longitudinal wall 56 of the rail member 22 respectively.

Preferably, the first wall 62a, the second wall 62b, and the longitudinal wall 56 of the rail member 22 jointly define a channel 86, and the first movable rail 88 is mounted in the channel 86 of the rail member 22 and can be longitudinally displaced with respect to the rail member 22. Preferably, the first movable rail 88 is movably mounted between the rail member 22 and the second movable rail 90.

Figure 4:
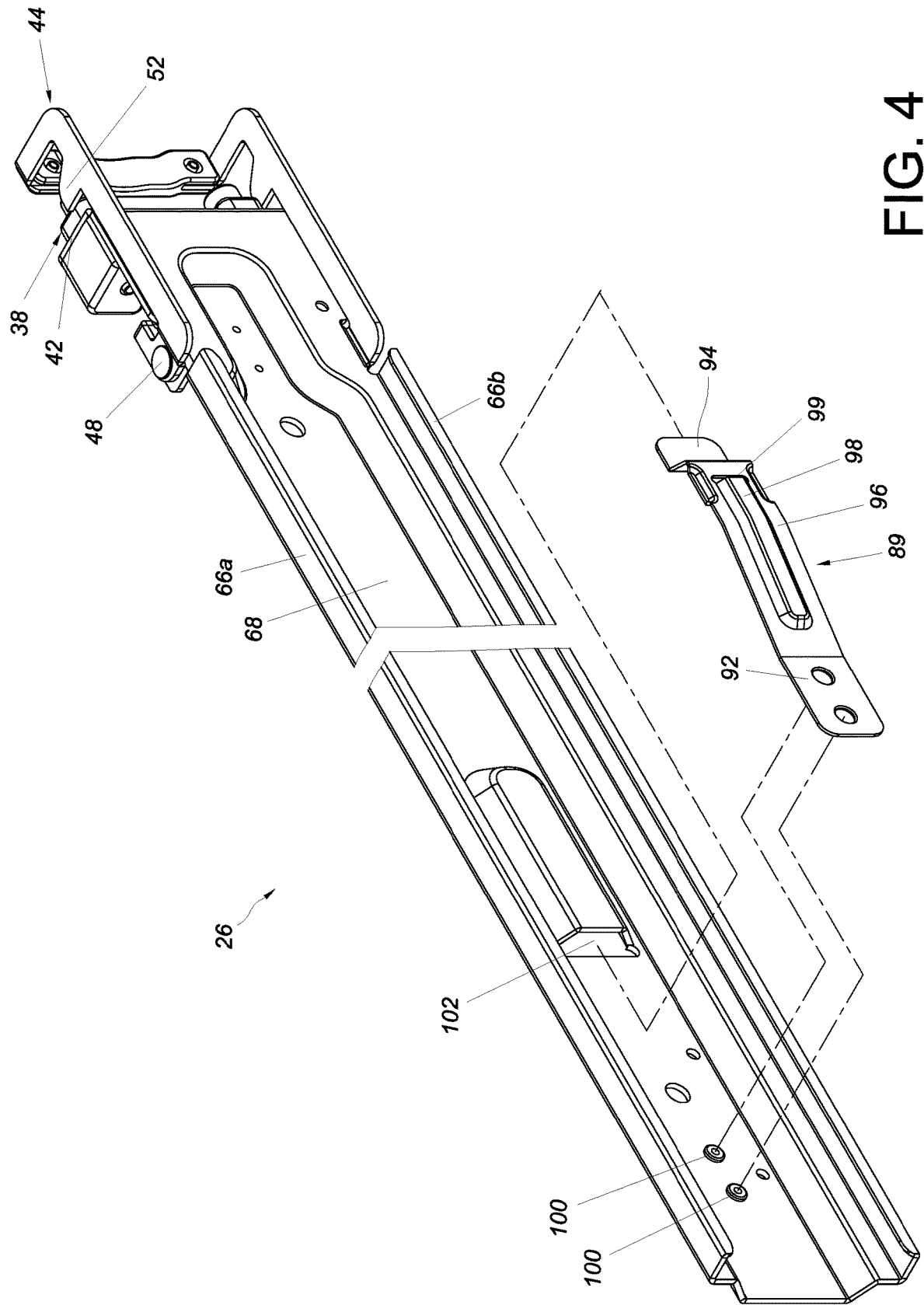
FIG. 4 is an exploded perspective view of a bracket device of the slide rail assembly having the first-type bracket mechanism according to the embodiment of the present invention.

As shown in FIG. 2, at least one of the first bracket device 24 (or the first longitudinal portion 54) and the rail member 22 (or the longitudinal wall 56) includes a first structure. Here, each of the first bracket device 24 (or the first longitudinal portion 54) and the rail member 22 (or the longitudinal wall 56) includes the first structure, and the two first structures are in communication with each other. For example, the two first structures are a first aperture 87a and a second aperture 87b that are in communication with each other; in practice, however, the number and configuration of the first structure may vary. In addition, referring to FIG. 4, the second bracket device 26 (or the second longitudinal portion 68) includes a second structure, such as but not limited to an elastic component 89.

Preferably, the elastic component 89 includes a fixing portion 92, an operating portion 94, and an elastic portion 96 located between the fixing portion 92 and the operating portion 94, the elastic portion 96 is provided with an engaging feature 98, and the engaging feature 98 has an engaging end 99. More specifically, the fixing portion 92 may be fixed on one side of the second bracket device 26 (or of the second longitudinal portion 68) by at least one fixing section 100, the elastic portion 96 is tilted up with respect to the fixing portion 92 and therefore exerts an elastic force toward the first bracket device 24 (or the first longitudinal portion 54), and the operating portion 94 extends from the aforesaid side of the second bracket device 26 (or of the second longitudinal portion 68) to the opposite side of the second bracket device 26 (or of the second longitudinal portion 68) through a through hole 102 in the second bracket device 26 (or in the second longitudinal portion 68).

Figure 5:
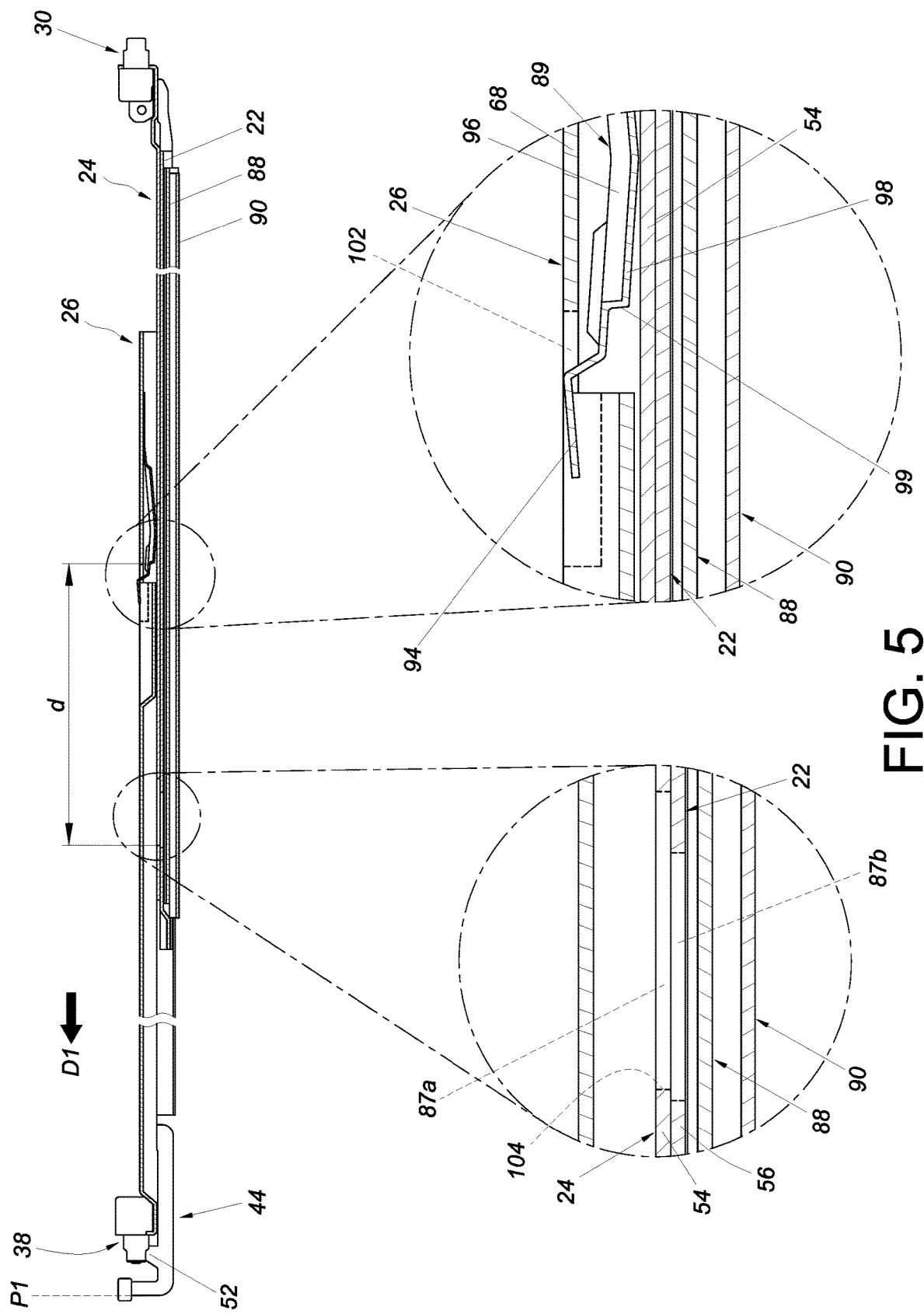
FIG. 5 is a schematic view of the slide rail assembly having the first-type bracket mechanism according to the embodiment of the present invention, wherein the bracket device is at a first position.

Referring to FIG. 5, the second bracket device 26 can be adjusted to a first predetermined position P1 with respect to the rail member 22. When the second bracket device 26 is at the first predetermined position P1, the elastic component 89 is spaced apart from the first aperture 87a of the first bracket device 24 (or of the first longitudinal portion 54) by a predetermined longitudinal distance d. Here, the predetermined longitudinal distance d is the distance between the engaging end 99 of the engaging feature 98 of the elastic component 89 and a blocking wall 104 of the first aperture 87a.

Figure 6:
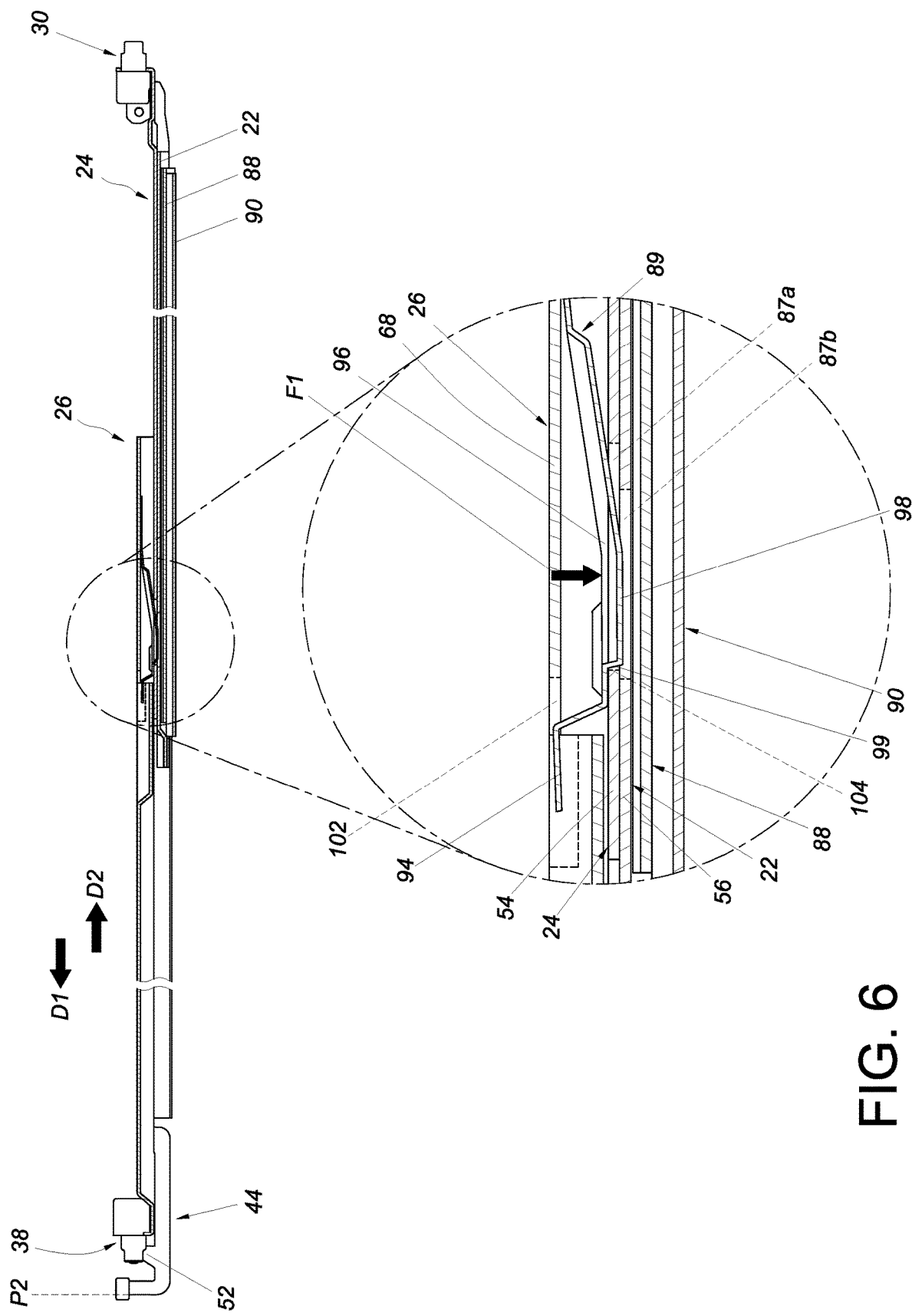
FIG. 6 is a schematic view of the slide rail assembly having the first-type bracket mechanism according to the embodiment of the present invention, wherein the bracket device is at a second position and is kept from being displaced in a certain direction due to an elastic component being blocked.

As shown in FIG. 5 and FIG. 6, the second bracket device 26 can be adjusted, i.e., displaced, in a first direction D1 with respect to the rail member 22 from the first predetermined position P1 to a second predetermined position P2 (see FIG. 6). When the second bracket device 26 is at the second predetermined position P2, the elastic component 89 is driven by its elastic force F1 into detachable engagement with the blocking wall of the first aperture 87a of the first bracket device 24 (or of the first longitudinal portion 54) and/or a blocking wall of the second aperture 87b of the rail member 22. Here, the elastic component 89 is detachably engaged with the blocking wall 104 of the first aperture 87a by way of example. For instance, when the engaging feature 98 of the elastic component 89 is engaged with the first aperture 87a and/or the second aperture 87b in response to the elastic force F1 of the elastic portion 96, the engaging end 99 of the engaging feature 98 abuts against the blocking wall 104 to prevent the second bracket device 26 from being displaced from the second predetermined position P2 in the first direction D1. It is worth mentioning that the second bracket device 26 in this state can be displaced with respect to the rail member 22 from the second predetermined position P2 to the first predetermined position P1 in a second direction D2, which is the opposite direction of the first direction D1.

Figure 7:
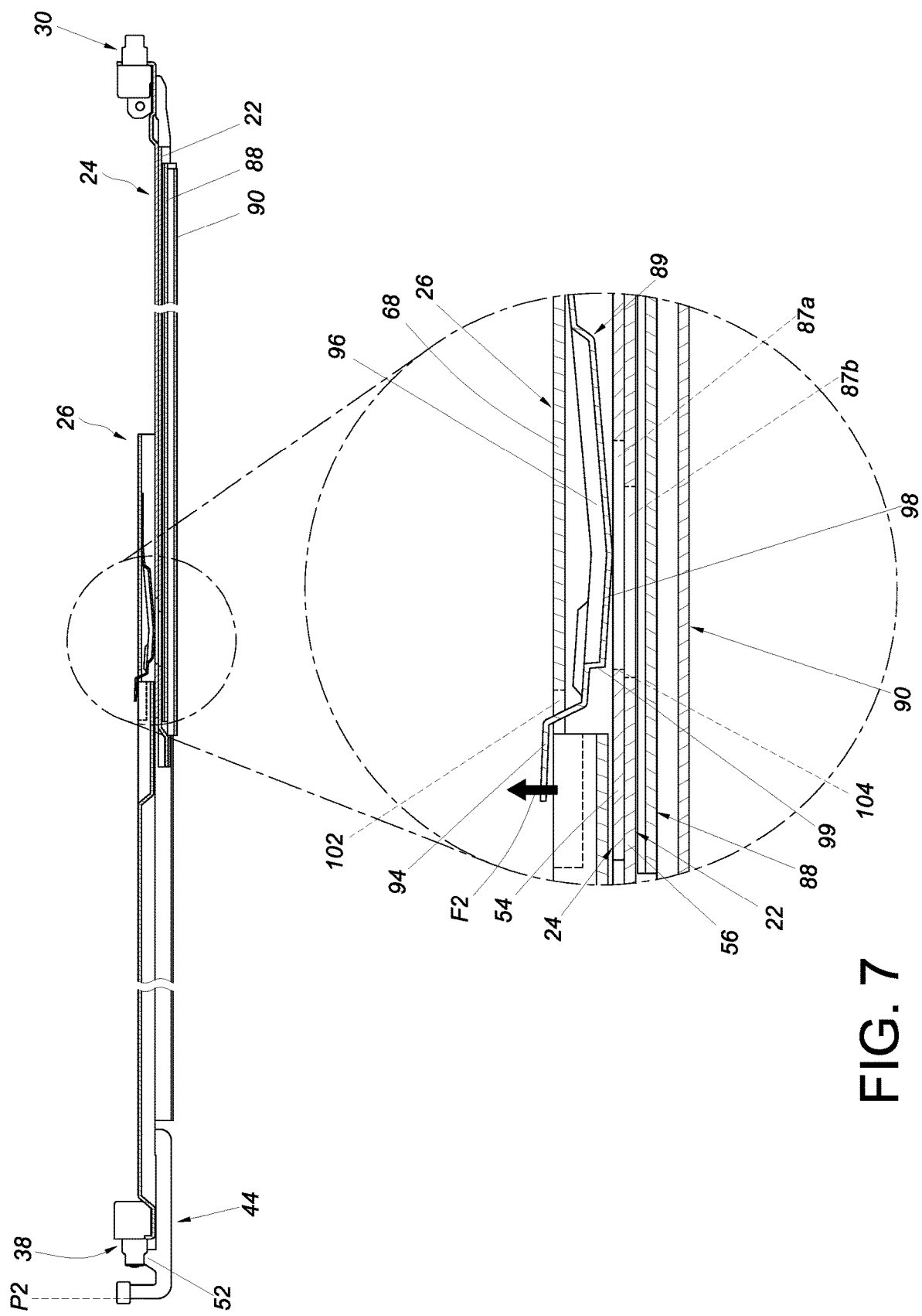
FIG. 7 is a schematic view of the slide rail assembly having the first-type bracket mechanism according to the embodiment of the present invention, with the bracket device at the second position, and yet the elastic component is no longer blocked.
Figure 8:
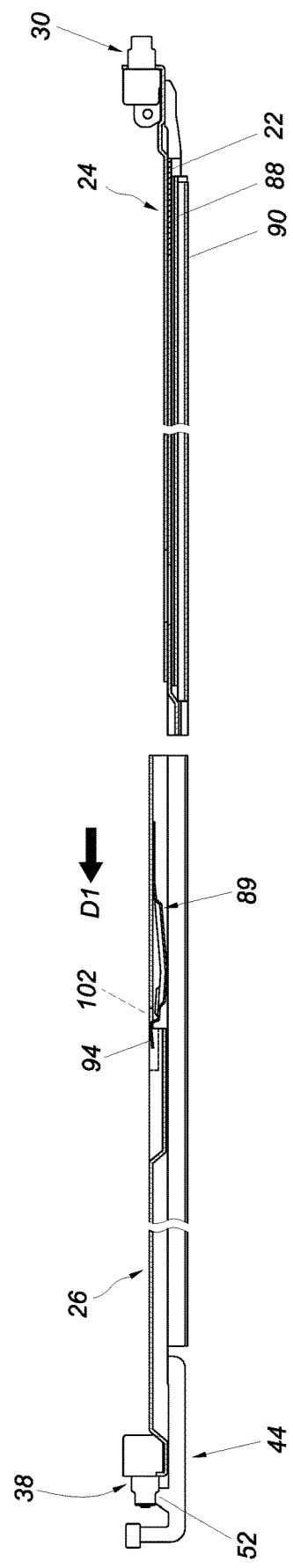
FIG. 8 is a schematic view of the slide rail assembly having the first-type bracket mechanism according to the embodiment of the present invention, wherein the bracket device is detached from a rail member of the slide rail assembly in the aforesaid direction.

Referring to FIG. 7 and FIG. 8, when it is desired to detach the second bracket device 26 from the one of the rail member 22 and the first bracket device 24, a user may apply an operating force F2 to the operating portion 94 of the elastic component 89 to overcome the elastic force F1 and thereby disengage the engaging end 99 of the engaging feature 98 of the elastic portion 96 of the elastic component 89 from the blocking wall of the first aperture 87a and/or of the second aperture 87b. Here, the engaging end 99 is disengaged from the blocking wall 104 of the first aperture 87a by way of example. Once the engaging end 99 is disengaged, the second bracket device 26 at the second predetermined position P2 can be detached from the one of the rail member 22 and the first bracket device 24 in the first direction D1.

Figure 9:
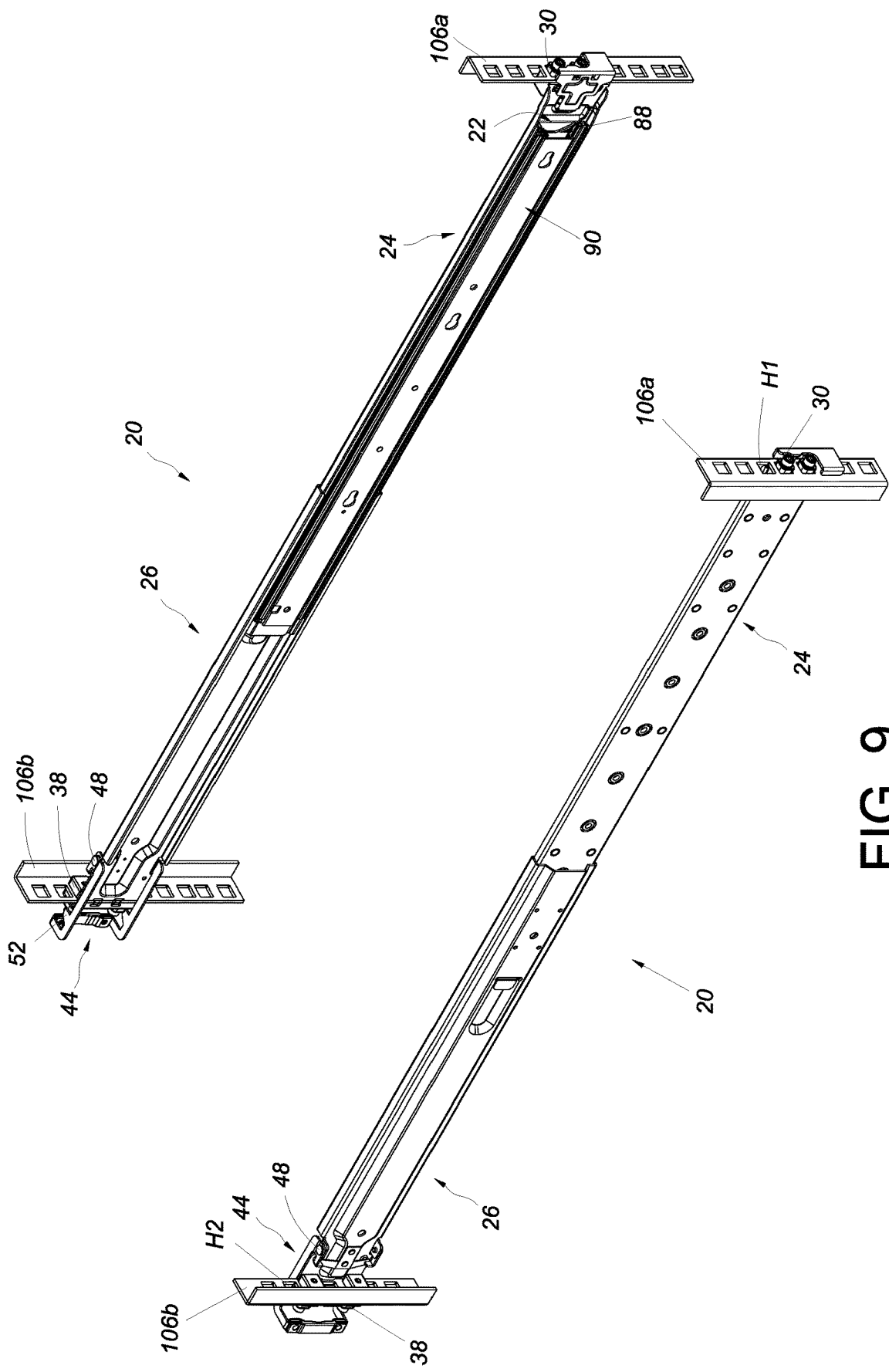
FIG. 9 is a perspective view showing that the slide rail assembly according to the embodiment of the present invention is applied to a first-type rack through the first-type bracket mechanism.
Figure 10:
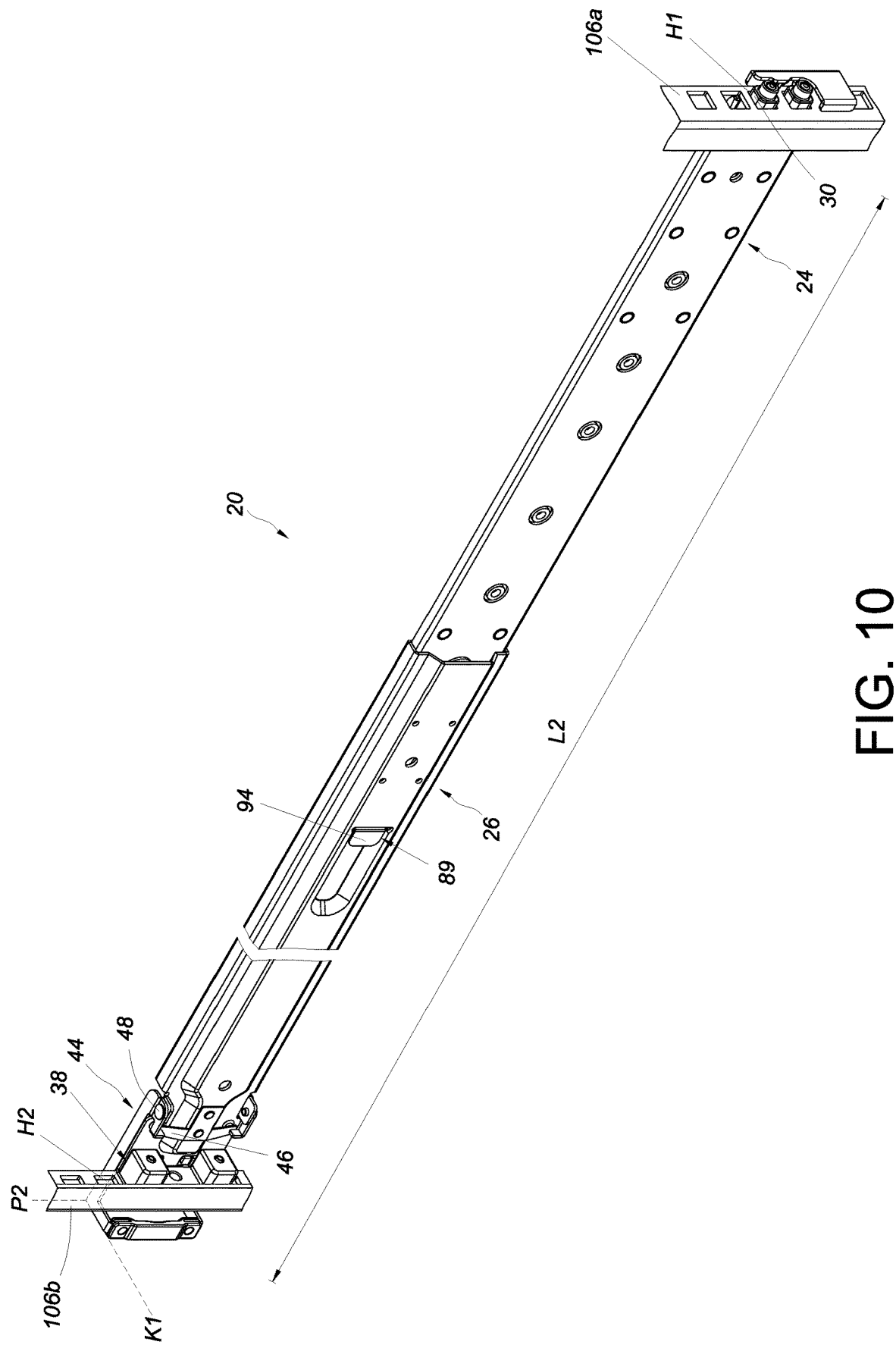
FIG. 10 is a perspective view showing that the slide rail assembly according to the embodiment of the present invention is mounted on two posts of the first-type rack through the first-type bracket mechanism, wherein the first-type rack has a longitudinal depth.

According to the above, a pair of slide rail assemblies 20 according to the foregoing embodiment of the present invention can be applied to a rack of a first type as shown in FIG. 9 and FIG. 10. The rack of the first type may be, for example, a rack with four posts, or a four-post rack. More specifically, the rack of the first type has a first side and a second side, with a first post 106a and a second post 106b arranged on each of the first side and the second side and spaced apart by a longitudinal distance. The pair of slide rail assemblies 20 can be mounted on the first side and the second side respectively. For example, the first bracket device 24 and the second bracket device 26 of each slide rail assembly 20 can be used to mount the rail member 22 of the slide rail assembly 20 on the rack of the first type, with the at least one first mounting member 30 of the first bracket device 24 mounted in the at least one first post hole H1 of the corresponding first post 106a, and with the at least one second mounting member 38 of the second bracket device 26 mounted in the at least one second post hole H2 of the corresponding second post 106b.

Preferably, both the first bracket device 24 and the second bracket device 26 are provided with their respective fastening members. Take the second bracket device 26 for example. The fastening member 44 of the second bracket device 26 can stay at the locking position K1 in response to the elastic force of the elastic member 46 in order for the fastening portion 52 of the fastening member 44 to be adjacent to the at least one second mounting member 38 and locked to the corresponding second post 106b. It is worth mentioning that the second bracket device 26 can be displaced with respect to the rail member 22 (or the first bracket device 24) to any position. In FIG. 10 for example, the second bracket device 26 is shown at the second predetermined position P2.

Figure 11:
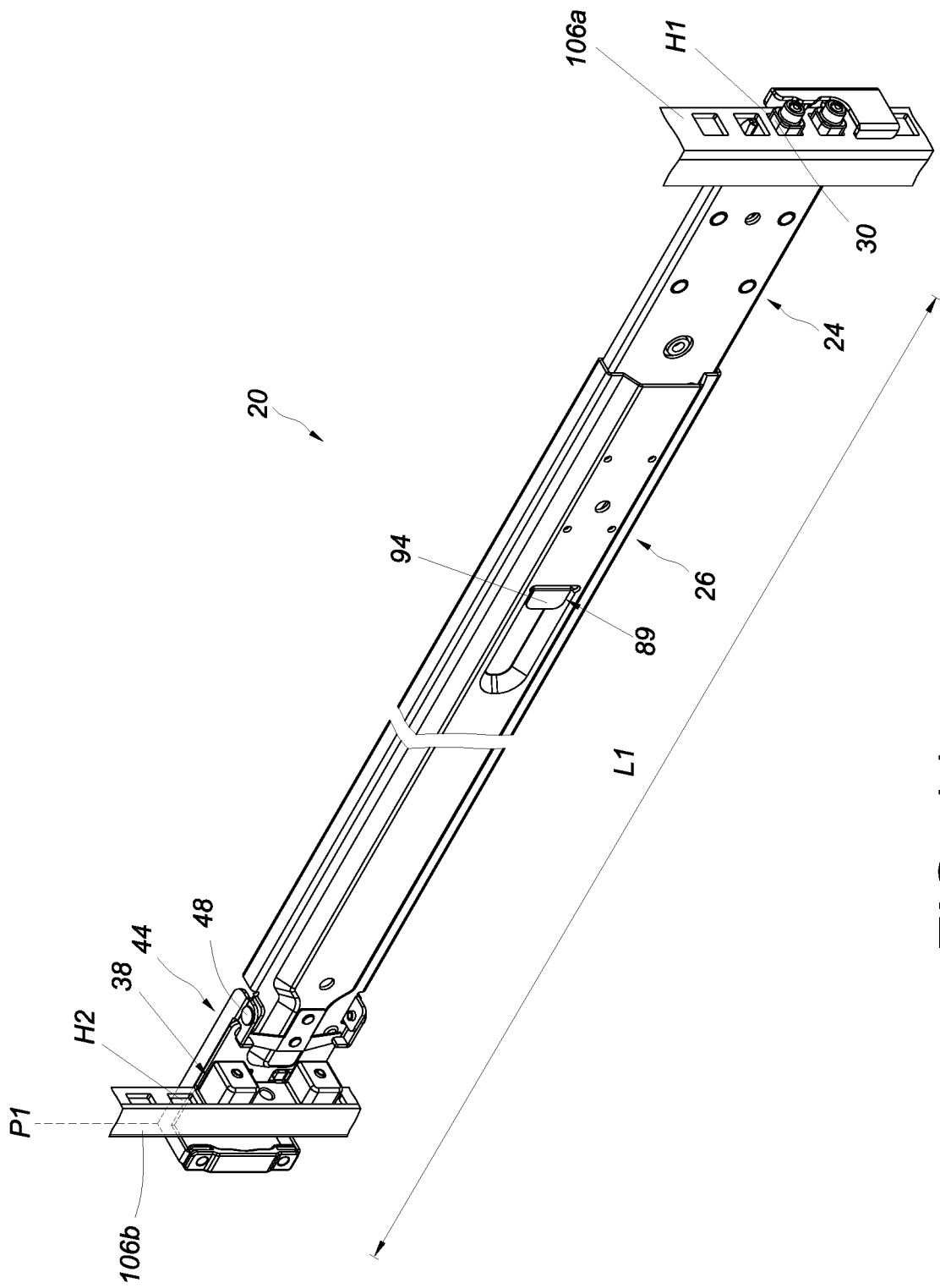
FIG. 11 is another perspective view showing that the slide rail assembly according to the embodiment of the present invention is mounted on two posts of the first-type rack through the first-type bracket mechanism, wherein the first-type rack has another longitudinal depth.

Referring to FIG. 11, the second bracket device 26 can be displaced with respect to the rail member 22 (or the first bracket device 24) to the first predetermined position P1 such that the second mounting member 38 of the second bracket device 26 and the first mounting member 30 of the first bracket device 24 define a first length L1 therebetween, thereby adapting the slide rail assembly 20 to a rack of the first type whose corresponding first and second posts 106a and 106b define a first longitudinal depth therebetween. When the second bracket device 26 is at the second predetermined position P2 with respect to the rail member 22 (or the first bracket device 24) instead, as shown in FIG. 10, the second mounting member 38 of the second bracket device 26 and the first mounting member 30 of the first bracket device 24 define a second length L2 therebetween, and the second length L2 is greater than the first length L1 to adapt the slide rail assembly 20 to a rack of the first type whose corresponding first and second posts 106a and 106b define a second longitudinal depth therebetween.

Referring to FIG. 12 and FIG. 13, when it is desired to detach the slide rail assembly 20 from a rack of the first type on whose corresponding first and second posts 106a and 106b the slide rail assembly 20 has been mounted through the first bracket device 24 and the second bracket device 26 respectively, the fastening member 44 can be operated in a tool-free manner and thereby pivoted from the locking position K1 to an unlocking position K2, where the fastening portion 52 of the fastening member 44 is not locked to the corresponding second post 106b. The second bracket device 26 can then be detached from the corresponding second post 106b, and the first bracket device 24 from the corresponding first post 106a, too.

Figure 14:
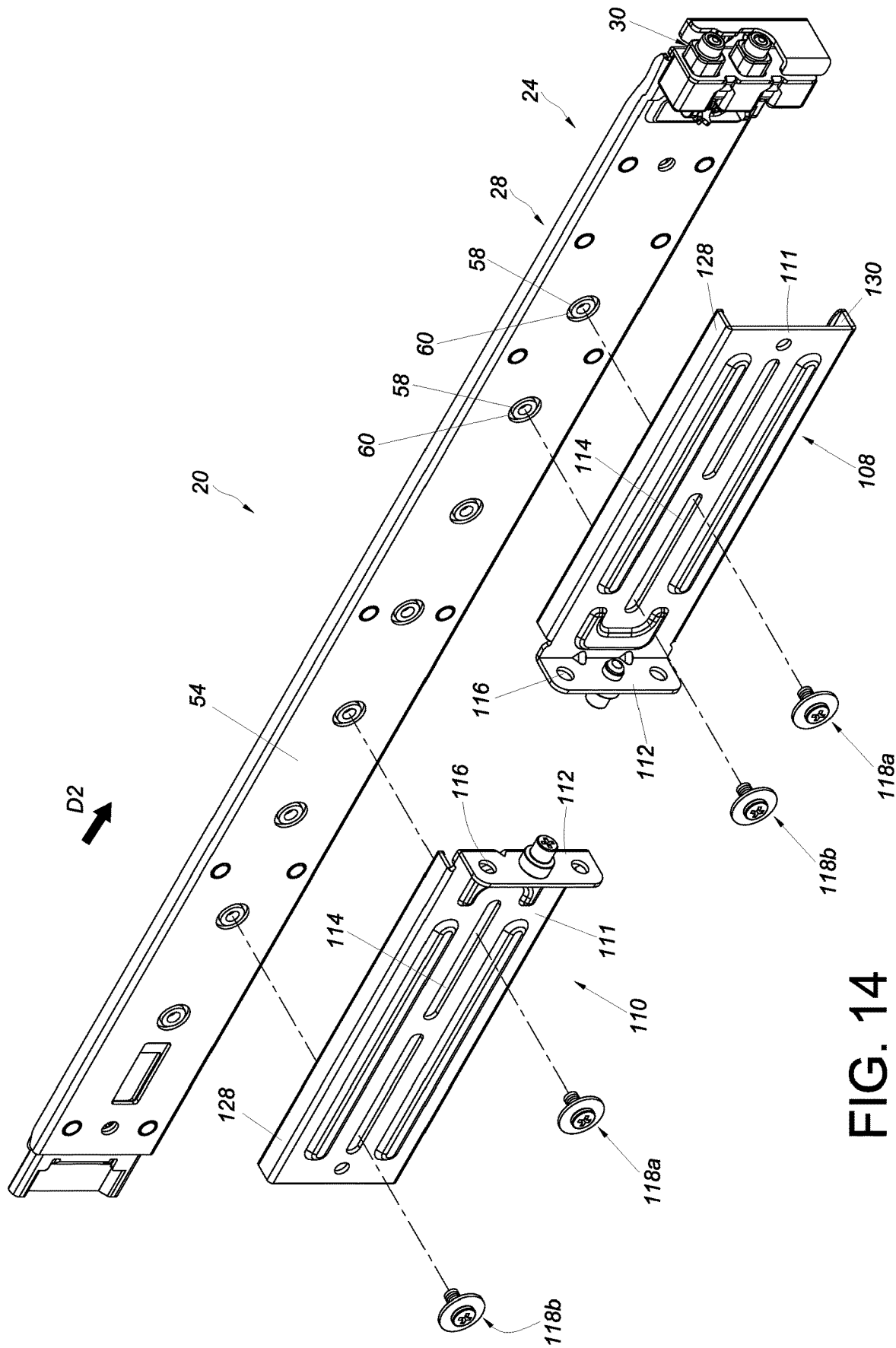
FIG. 14 is an exploded perspective view of the slide rail assembly having a second-type bracket mechanism according to the embodiment of the present invention.
Figure 15:
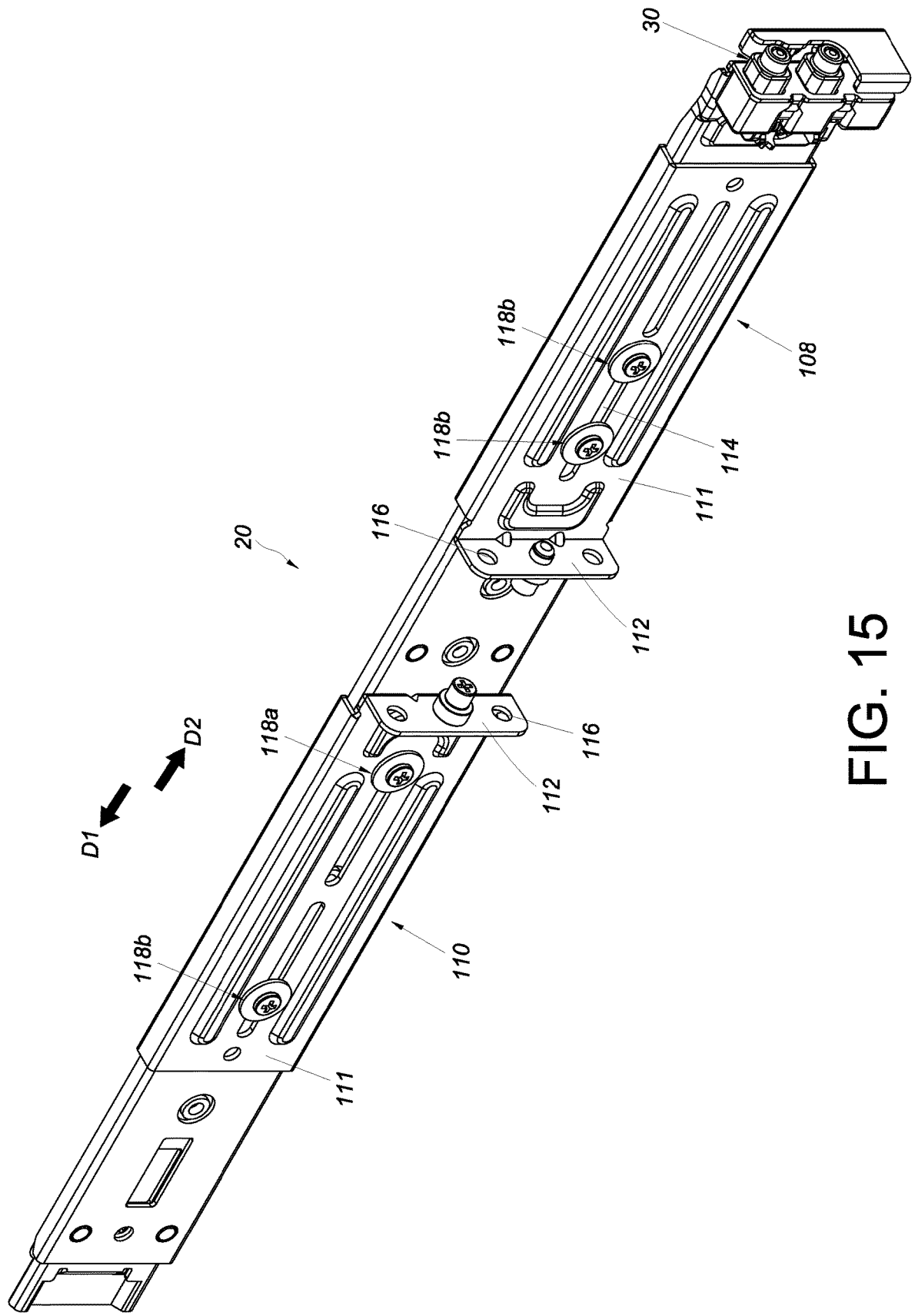
FIG. 15 is an assembled perspective view of the slide rail assembly having a second-type bracket mechanism according to the embodiment of the present invention.

Referring to FIG. 14 and FIG. 15, the slide rail assembly 20 further includes a first bracket member 108 and/or a second bracket member 110. More specifically, after detaching the second bracket device 26 from the one of the rail member 22 and the first bracket device 24 (see FIG. 8), the first bracket member 108 and the second bracket member 110 are detachably mounted on the one of the rail member 22 and the first bracket device 24. For example, the first bracket member 108 and the second bracket member 110 are detachably mounted on the first sidewall 28 of the first bracket device 24. The first bracket member 108 and the second bracket member 110 can be adjusted, i.e., displaced, along the length direction of the rail member 22.

Preferably, the first bracket member 108 and the second bracket member 110 have substantially the same structural configuration. Take the first bracket member 108 for example. The first bracket member 108 includes a base portion 111 and a mounting portion 112 substantially perpendicularly bent with respect to the base portion 111. The first bracket member 108 further has an upper supporting wall 128 and a lower supporting wall 130 such that the base portion 111 is connected between the upper supporting wall 128 and the lower supporting wall 130. The base portion 111 is provided with at least one longitudinal feature 114 that has a boundary (such as but not limited to at least one slot), and the mounting portion 112 is provided with at least one mounting feature 116 (such as but not limited to at least one hole).

Preferably, the first bracket member 108 and the second bracket member 110 are mounted on the first sidewall 28 of the first bracket device 24, and each bracket member 108, 110 is locked to at least one of the mounting features 58 of the rail member 22 by at least one fixing member (such as a first fixing member 118a and a second fixing member 118b, e.g., bolts or screws) that extends through a portion of the longitudinal feature 114 and the corresponding at least one hole 60 in the first longitudinal portion 54 of the first sidewall 28. Thus, the first bracket member 108 and the second bracket member 110 support the first bracket device 24 through their respective base portions 111, upper supporting walls 128, and lower supporting walls 130 and can be adjusted, i.e., displaced, with respect to the rail member 22 to a limited extent in the second direction D2 as well as the first direction D1.

Figure 16:
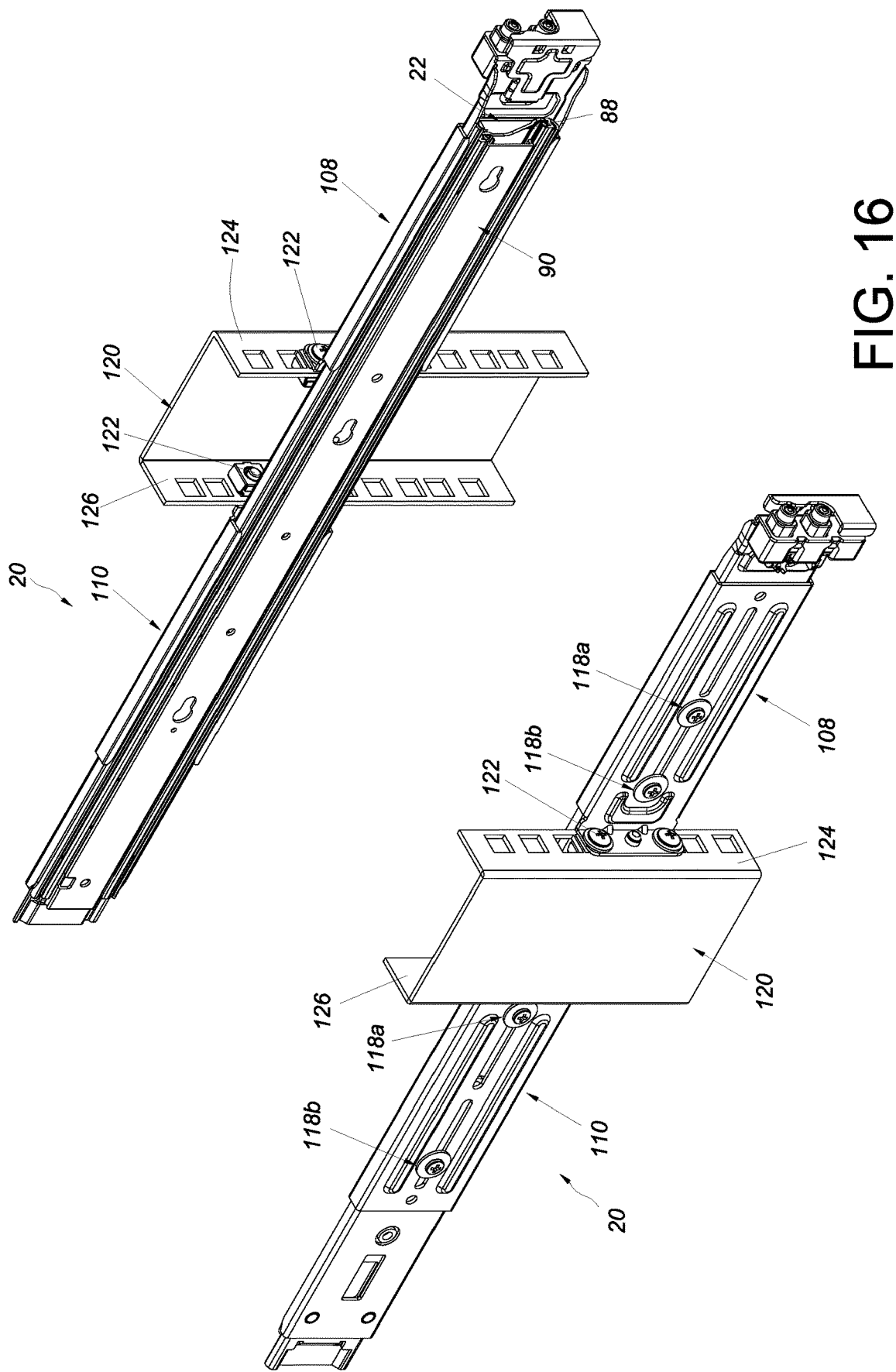
FIG. 16 is a perspective view showing that the slide rail assembly according to the embodiment of the present invention is applied to a second-type rack through the second-type bracket mechanism.
Figure 17:
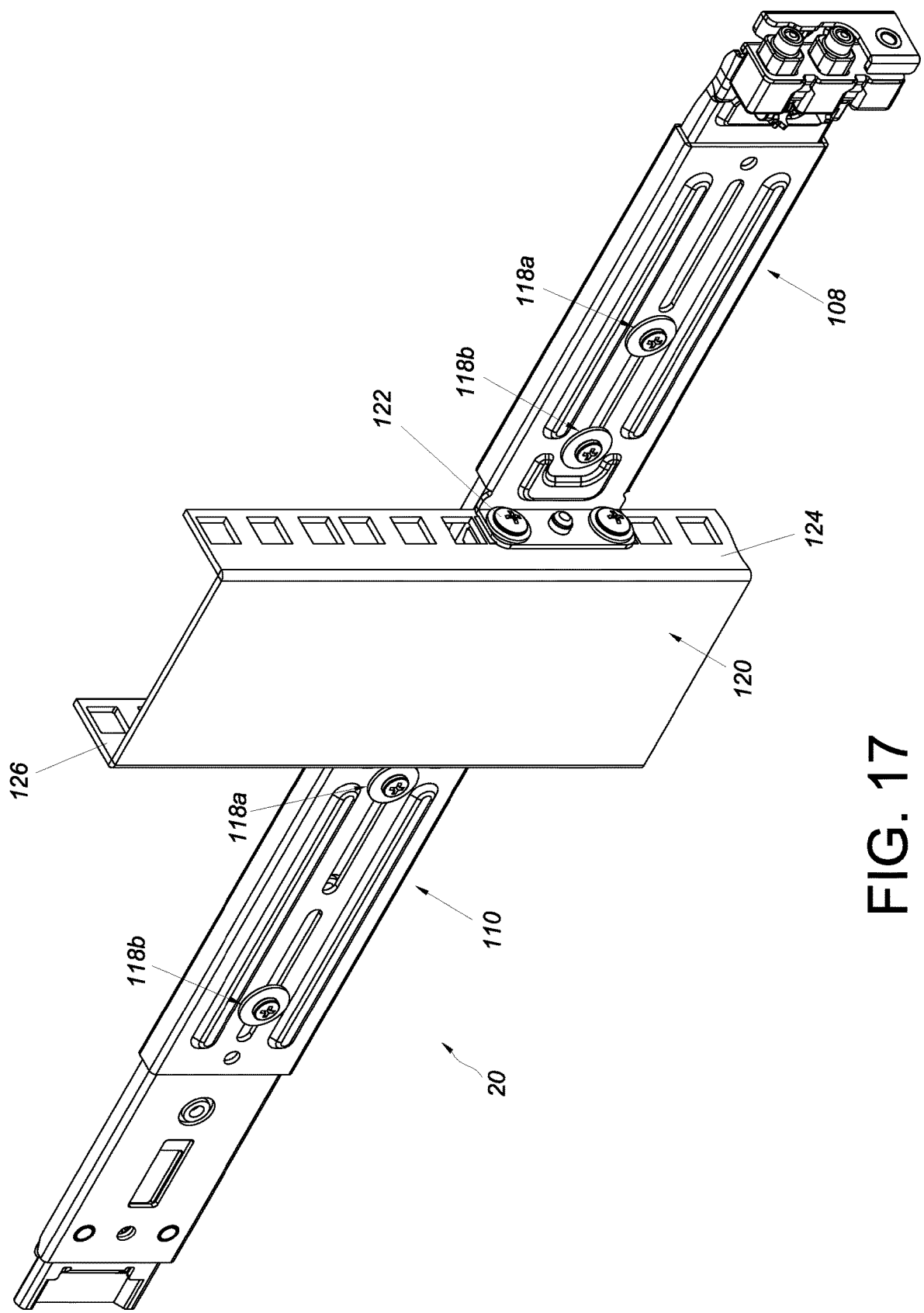
FIG. 17 is a perspective view showing that the slide rail assembly according to the embodiment of the present invention is mounted on a single post of the second-type rack through the second-type bracket mechanism.

Referring to FIG. 16 and FIG. 17, a pair of slide rail assemblies 20 can be applied to a rack of a second type. The rack of the second type may be, for example, a rack with two posts, or a two-post rack. More specifically, the rack of the second type has a first side and a second side, and a post 120 is arranged on each of the first side and the second side. The pair of slide rail assemblies 20 can be mounted on the first side and the second side respectively. For example, the first bracket member 108 and the second bracket member 110 of each slide rail assembly 20 can be used to mount the rail member 22 of the slide rail assembly 20 on the rack of the second type, wherein the at least one mounting feature 116 of the first bracket member 108 allows passage of at least one connecting member 122 driven by a tool (such as but not limited to a screwdriver) so that the first bracket member 108 can be mounted to a hole in a first predetermined portion 124 of the corresponding post 120 of the rack of the second type through the at least one connecting member 122, and wherein the second bracket member 110 can be mounted in a similar way to a hole in a second predetermined portion 126 of the corresponding post 120 of the rack of the second type through at least one different connecting member 122. It is worth mentioning that each post 120 is at a substantially intermediate position between a front portion and a rear portion of the slide rail assembly 20 mounted on the post 120.

It can be known from the above that the slide rail assembly 20 provided by the foregoing embodiment of the present invention preferably has the following features:

1. An user may choose to use the second bracket device 26 (see FIG. 1) or the bracket members 108 and 110 (see FIG. 15) as needed. When the second bracket device 26 is used, the slide rail assembly 20 can be mounted on a rack of the first type through the second bracket device 26 and the first bracket device 24. When the bracket members 108 and 110 are used instead, the slide rail assembly 20 can be mounted on a rack of the second type through the bracket members 108 and 110.
2. The second bracket device 26 is detachably mounted on the first sidewall 28 of the first bracket device 24 and can be adjusted, i.e., displaced, along the length direction of the rail member 22. Therefore, the distance by which the second bracket device 26 can be adjusted, i.e., displaced, with respect to the rail member 22 is greater than in the prior art.

3. The rail member 22, the first sidewall 28 of the first bracket device 24, and the second sidewall 36 of the second bracket device 26 can support one another, and this helps increase the supporting strength between the rail member 22, the first bracket device 24, and the second bracket device 26.

4. The rail member 22, the first sidewall 28 of the first bracket device 24, and the first bracket member 108 can support one another, and/or the rail member 22, the first sidewall 28 of the first bracket device 24, and the second bracket member 110 can support one another. This helps increase the supporting strength between the rail member 22, the first bracket device 24, and the bracket members 108 and 110.

While the present invention has been disclosed through the preferred embodiment described above, the embodiment is not intended to be restrictive of the scope of the invention. The scope of the patent protection sought by the applicant is defined by the appended claims.

What is claimed is:

1. A slide rail assembly, comprising:
   a rail member, the rail member including a first wall, a second wall, and a longitudinal wall connected between the first wall and the second wall;
   a first bracket device arranged on the rail member, the first bracket device including a first sidewall and at least one first mounting member, the first sidewall including a first portion, a second portion, and a first longitudinal portion arranged between the first portion and the second portion, the first portion, the second portion, and the first longitudinal portion of the first bracket device being respectively adjacent to the first wall, the second wall, and the longitudinal wall of the rail member;
      a second bracket device detachably mounted on one of the rail member and the first bracket device, wherein the second bracket device is adjustable to displace with respect to the rail member; and
      a first bracket member;
      wherein the first bracket member is able to be detachably mounted on the one of the rail member and the first bracket device after the second bracket device is detached from the one of the rail member and the first bracket device, the first bracket device and the second bracket device being configured to mount the rail member on a rack of a first type, and the rack of the first type is a four-post rack; and wherein the at least one first mounting member is configured to be mounted on a first post of the rack of the first type, the second bracket device includes a second sidewall and at least one second mounting member, the second sidewall includes a third portion, a fourth portion, and a second longitudinal portion arranged between the third portion and the fourth portion, the third portion, the fourth portion, and the second longitudinal portion of the second bracket device define a supporting channel for receiving the first sidewall of the first bracket device, and the at least one second mounting member is configured to be mounted on a second post of the rack of the first type.

2. The slide rail assembly of claim 1, wherein the second bracket device further includes a fastening member pivotally connected to the second sidewall and an elastic member, and the fastening member is configured to stay at a locking position in response to an elastic force of the elastic member in order to be locked to the second post of the rack of the first type.

3. The slide rail assembly of claim 1, wherein the third portion, the fourth portion, and the second longitudinal portion of the second sidewall of the second bracket device are configured to respectively partially enclose the first portion, the second portion, and the first longitudinal portion of the first sidewall of the first bracket device.

4. The slide rail assembly of claim 3, wherein the second bracket device and the first bracket device define a first length therebetween when the second bracket device is at a first predetermined position with respect to the rail member, and the second bracket device and the first bracket device define a second length therebetween when the second bracket device is at a second predetermined position with respect to the rail member, the second length being greater than the first length.

5. The slide rail assembly of claim 1, wherein the first bracket device is connected to the rail member, at least one of the first bracket device and the rail member includes a first structure, the second bracket device includes a second structure, and the second structure is configured for detachable engagement with the first structure.

6. The slide rail assembly of claim 1, further comprising a second bracket member configured to be detachably mounted on the one of the rail member and the first bracket device, wherein the first bracket member and the second bracket member are configured to mount the rail member on a rack of a second type, and the rack of the second type is a two-post rack.

7. The slide rail assembly of claim 6, wherein the first bracket member and the second bracket member are adjustable to displace with respect to the rail member.

8. The slide rail assembly of claim 6, wherein each of the first bracket member and the second bracket member includes at least one mounting feature that allows passage of at least one connecting member so that the first bracket member and the second bracket member are mountable on a post of the rack of the second type through the at least one connecting member.

9. The slide rail assembly of claim 1, further comprising at least one movable rail mounted in a channel of the rail member, and the at least one movable rail is displaceable with respect to the rail member.

10. A slide rail assembly, comprising:
    a rail member including a first wall, a second wall, and a longitudinal wall connected between the first wall and the second wall;
    a first bracket device arranged on and connected to the rail member, at least one of the first bracket device and the rail member includes a first structure, the first bracket device including a first sidewall, the first sidewall including a first portion, a second portion, and a first longitudinal portion arranged between the first portion and the second portion, and the first portion, the second portion, and the first longitudinal portion of the first bracket device being configured to respectively support the first wall, the second wall, and the longitudinal wall of the rail member;
    a second bracket device arranged on the first sidewall of the first bracket device, the second bracket device including a second sidewall; the second sidewall includes a third portion, a fourth portion, and a second longitudinal portion arranged between the third portion and the fourth portion; and the third portion, the fourth portion, and the second longitudinal portion of the second bracket device being configured to respectively support the first portion, the second portion, and the first longitudinal portion of the first bracket device, the second bracket device further including a second structure, and the second structure is configured for detachable engagement with the first structure; and a first bracket member and a second bracket member, the first bracket member and the second bracket member being able to be detachably mounted on the first sidewall of the first bracket device subsequent to the second bracket device being detached from the rail member.

11. The slide rail assembly of claim 10, wherein the first bracket device further includes at least one first mounting member, the second bracket device further includes at least one second mounting member, the at least one first mounting member is configured to mount the rail member on a first post of a rack of a first type, and the at least one second mounting member is configured to mount the rail member on a second post of the rack of the first type.

12. The slide rail assembly of claim 10, wherein the second bracket device and the first bracket device define a first length therebetween when the second bracket device is at a first predetermined position with respect to the rail member, and the second bracket device and the first bracket device define a second length therebetween when the second bracket device is at a second predetermined position with respect to the rail member, the second length being greater than the first length.

13. The slide rail assembly of claim 10, wherein the first bracket member and the second bracket member are adjustable to displace with respect to the rail member.

14. The slide rail assembly of claim 10, wherein the first bracket member and the second bracket member are configured to mount the rail member on a rack of a second type.

15. The slide rail assembly of claim 14, wherein each of the first bracket member and the second bracket member includes at least one mounting feature that allows passage of at least one connecting member so that the first bracket member and the second bracket member are mountable on a post of the rack of the second type through the at least one connecting member.

* * * * *